(12) United States Patent
Boyapati et al.

(10) Patent No.: US 9,245,795 B2
(45) Date of Patent: Jan. 26, 2016

(54) METHODS OF FORMING SUBSTRATE MICROVIAS WITH ANCHOR STRUCTURES

(71) Applicant: Intel Corporation, Santa Clara, CA (US)

(72) Inventors: Sri Ranga Sai Boyapati, Chandler, AZ (US); Qinglei Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 86 days.

(21) Appl. No.: 13/903,368

(22) Filed: May 28, 2013

(65) Prior Publication Data

US 2014/0353831 A1 Dec. 4, 2014

(51) Int. Cl.
*H01L 23/48* (2006.01)
*H01L 23/52* (2006.01)
*H01L 29/40* (2006.01)
*H01L 21/768* (2006.01)

(52) U.S. Cl.
CPC ........ *H01L 21/76877* (2013.01); *H01L 23/481* (2013.01); *H01L 2924/0002* (2013.01)

(58) Field of Classification Search
CPC .................. H01L 21/76877; H01L 23/481

USPC ......................................................... 257/762
See application file for complete search history.

(56) References Cited

U.S. PATENT DOCUMENTS

| | | | | |
|---|---|---|---|---|
| 5,930,669 | A * | 7/1999 | Uzoh ................ | H01L 21/76844 257/E21.577 |
| 6,400,619 | B1 * | 6/2002 | Hsu et al. ....................... | 365/200 |
| 6,548,905 | B2 * | 4/2003 | Park ................... | H01L 21/76805 257/748 |
| 6,576,869 | B1 * | 6/2003 | Gower et al. ............ | 219/121.71 |
| 7,247,035 | B2 * | 7/2007 | Mok et al. ........................ | 439/81 |
| 7,517,736 | B2 * | 4/2009 | Mehta ................ | H01L 21/76802 257/E21.575 |
| 2001/0006828 | A1 * | 7/2001 | McMahon ..................... | 438/109 |
| 2004/0157442 | A1 * | 8/2004 | Cowley et al. ................ | 438/687 |
| 2008/0012142 | A1 * | 1/2008 | Mehta et al. .................. | 257/762 |

\* cited by examiner

*Primary Examiner* — Nicholas Tobergte
(74) *Attorney, Agent, or Firm* — Winkle, PLLC

(57) ABSTRACT

Methods of forming anchor structures in package substrate microvias are described. Those methods and structures may include forming a titanium layer in an opening of a package substrate using a first deposition process, wherein the opening comprises an undercut region, and wherein the first conductive layer does not substantially form in an anchor region of the undercut region. The titanium layer may then be re-sputtered using a second deposition process, wherein the titanium layer is formed in the anchor region.

11 Claims, 9 Drawing Sheets

METHODS OF FORMING SUBSTRATE MICROVIAS WITH ANCHOR STRUCTURES

BACKGROUND OF THE INVENTION

As microelectronic technology advances for higher performance, microelectronic packaging substrates require increased adhesion of materials, such as copper adhesion within microvia structures. Semi-additive processing may be used to build up the copper/conductive layers that may be separated by insulating/dielectric materials within the package substrate. In some cases, electro-less deposition processing may be used to build up copper/conductive layers. Electro-less deposition typically requires roughening of underlying dielectric materials, which is an impediment to the use of low loss dielectric materials, which are important for continued improvement of substrate performance.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1:
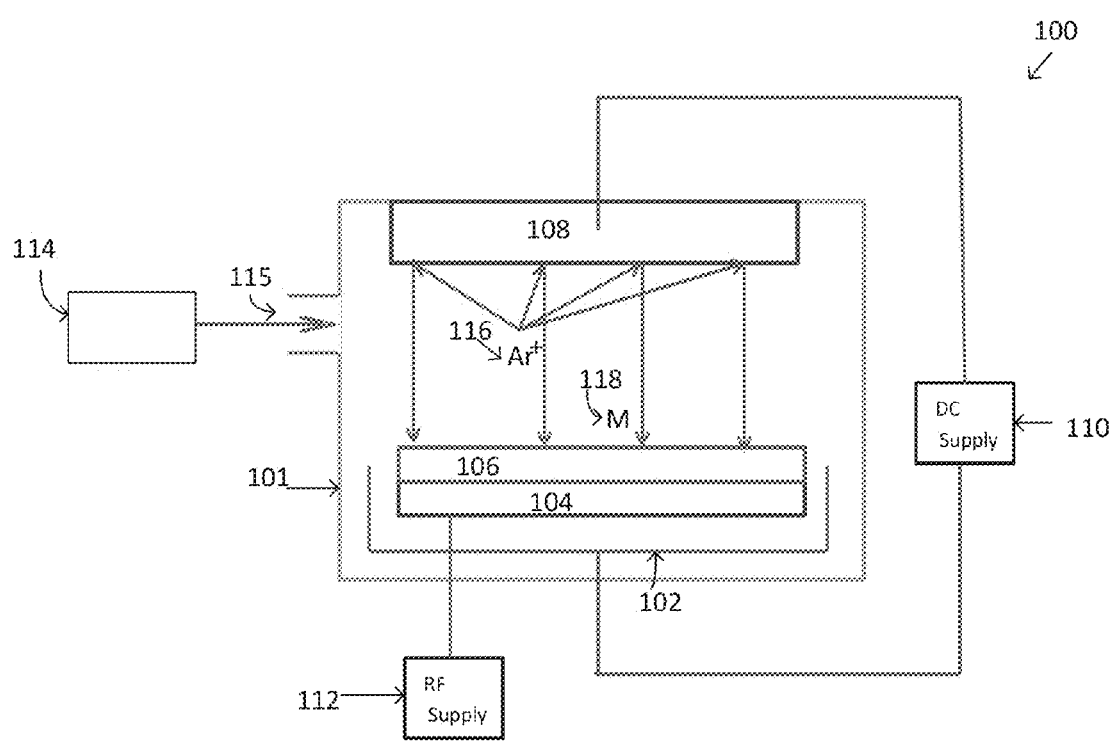
FIG. 1 represents a cross-sectional of a system to an embodiment.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as package substrates comprising microvias having anchor structures, are described. Those methods/structures may include forming a titanium layer disposed in a microvia of a package substrate, wherein a portion of the titanium layer is formed by re-sputtering in an anchor region that is located underneath a bottom portion of a dielectric layer adjacent the microvia. A copper layer may be formed on the titanium layer located in the anchor region. The re-sputtered anchor structure allows for greater adhesion of metallization on substrate microvias, and reduces discontinuities at metal-dielectric interfaces.

FIG. 1 illustrates a cross-sectional view of an embodiment of a deposition system 100, such as a physical vapor deposition system 100, including a vacuum chamber 101, that may be used to form microvia anchor structures of embodiments included herein. In an embodiment, the chamber 101 may be connected to/coupled with one or more vacuum pump(s) 114, such as a turbo pump and/or a cryogenic pump for example, to achieve vacuum conditions, such as high vacuum conditions on the order of $10^{-8}$ to about $10^{-10}$ Torr, in an embodiment. The pump(s) may be located in any suitable location with respect to the chamber 101, according to the particular application. High vacuum conditions tend to achieve high sputter efficiency by minimizing secondary plasma effects, and also enable the formation of high purity thin film depositions at an acceptable deposition rate.

In an embodiment, a substrate 106 may be located on a chuck 104. The chuck 104 may be disposed/coupled with an anode 102, wherein the anode 102 may be coupled to a DC power supply 110. An RF supply 112 may be coupled with the chuck 104, in an embodiment. The chuck 104 may comprise a mechanically and/or electrically controlled pedestal with which to mount a substrate 106. The system 100 may further comprise a gas inlet 115, wherein a gas or gases may enter the chamber 101. The gas inlet 115 may be located in any suitable location with respect to the chamber 101, according to the particular application. In an embodiment, an argon gas may be made available to the system 100 at various flow rates, depending upon the particular application.

A target 108, which may comprise a high purity metal target, may be disposed above/opposite the anode 102, and may comprise a cathode in an embodiment. The target 108 may comprise a material, such as titanium or copper for example, that may be formed on the substrate 104 subsequent to voltage application within the system 100. In an embodiment, argon atoms may be accelerated toward the target 108, and may remove/sputter target atoms, such as titanium or copper atoms, onto the substrate 104 by the application of DC voltage from the DC power supply 110. Such sputtering/deposition using DC power alone tends to form target material onto the substrate 106 in a line of sight manner. Application of RF power from an RF power source 112 (in addition to the application of DC power), allows for re-sputtering to occur during a deposition. Such re-sputtering serves to fill in voids that may occur in microelectronic structures, such voids that may be present in undercut regions of microvia structures in a package substrate, for example.

In general, plasma is generated in the vacuum chamber 101 by ionizing ions, such as argon ions 116 using a high DC power supply. These high energy argon ions 116 are attracted to the negatively charged target (cathode) 108 and due to the high moment of the argon 116, they physically remove target 108 ions and neutrals from the target 108. The target material 118 is then deposited/formed on the substrate 104.

Figure 2A:
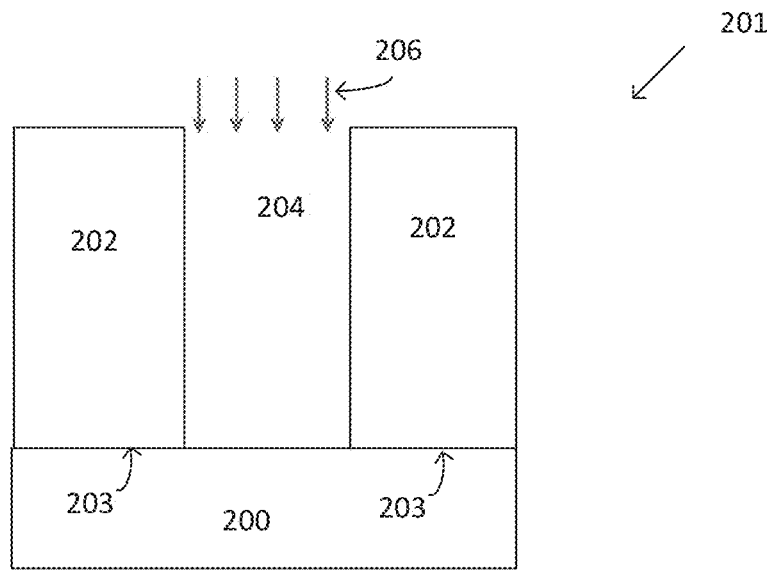
FIGS. 2a-2g represent cross-sectional views of structures according to embodiments.
Figure 2B:
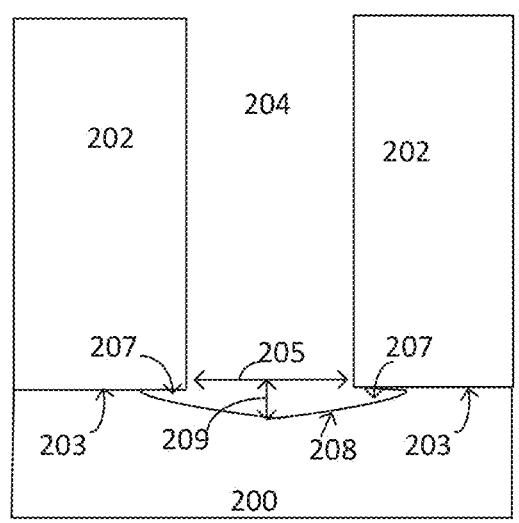

In an embodiment, a portion of a substrate, such as a package substrate 201 may comprise an opening 204 (FIG. 2a). The opening 204 may comprise a microvia structure 204, wherein dielectric regions 202 may be disposed adjacent the opening 204. A bottom portion 203 of the dielectric regions may be disposed on a substrate layer 200, which may comprise a conductive material layer 200, such as a metal material such as copper, in some embodiments. An etch process 206, such as a microvia etch forming process 206, may be performed in order to form an undercut region 208 that is located at a bottom portion of the microvia opening 204 (FIG. 2b).

The undercut region 208 may comprise a line of sight region 205 and an anchor region 207. In an embodiment, the line of sight region 205 may comprise a region located between the adjacent dielectric regions 202 and may extend a depth 209 into the substrate layer 200. The anchor region 207 may comprise a region located adjacent the line of site region 205 and underneath the bottom region 203 of the adjacent dielectric regions 202.

Figure 2C:
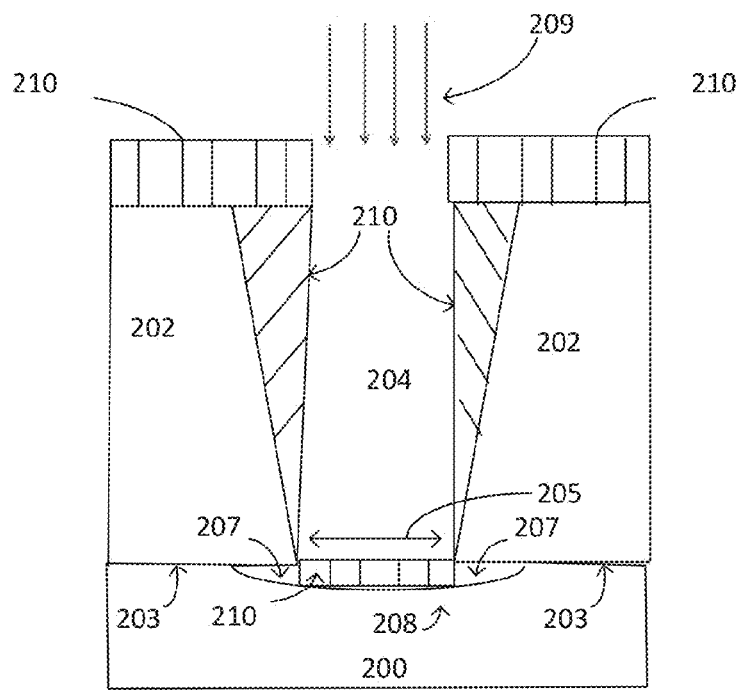

In an embodiment, a first conductive layer 210 may be formed in the microvia 204 by utilizing a first deposition process 209 (FIG. 2c). The first conductive layer 210 may comprise a titanium material 210 in an embodiment. The first conductive layer 210 may be substantially formed on the sidewalls of the dielectric material 202 and in the line of sight region 205 of the undercut region 208. In an embodiment, the first conductive layer 210 is formed utilizing a DC PVD process and does not employ an RF bias.

In an embodiment, due to line of sight limitations of the DC process in some cases, the deposition/formation of the first conductive layer 210 may be tapered, with bottom and sidewall formation within the microvia opening 204 having the lowest thickness. This tapering can cause problems such as poor adhesion of the first conductive layer (and subsequent conductive layers) in the undercut region 208, as well as creating a high resistance first conductive layer 210, such as a high resistance titanium adhesion layer, at the bottom of the microvia 204.

In an embodiment, the first conductive layer 210 is formed using the first deposition process 209 in a substantially line of sight manner, such that it is substantially formed within the microvia opening 204 and not within the anchor region 207 of the undercut region 208. The anchor region 207 is located adjacent the line of sight region 205 and underneath the sidewalls of the dielectric material 202. Thus, the anchor region 207 comprises little to no first conductive layer 210 subsequent the first deposition process 209.

In an embodiment, the first deposition process 209 may comprise a system base pressure of about $10^{-8}$ Torr, a process pressure of about 1 to about 25 mTorr, an argon flow rate of about 10 to about 100 standard cubic centimeters per minute (sccm), a pedestal temperature of about 40 degrees Celsius a DC power of between about 100 Kilo Watts (KW) to about 150 KW, and an RF bias of zero. The process time may vary depending upon the application, but in one embodiment may comprise between about 30 to about 90 seconds, and the first conductive layer 210 may comprise a thickness of about 100 nm.

Figure 2D:
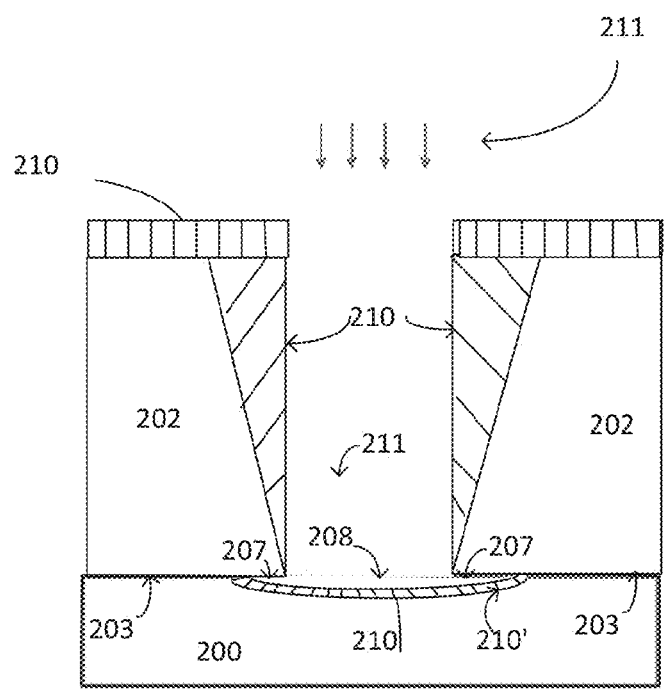

In an embodiment, a second deposition process 211, which may comprise a re-sputter deposition process 211 may be employed (FIG. 2d). The re-sputter process 211 may comprise both a DC power and an RF power component, wherein both DC and RF power maybe employed simultaneously during the second deposition process 211. In an embodiment, the re-sputter process 211 may comprise a process pressure of about 1 to about 25 mTorr, an argon flow rate of about 5 to about 25 sccm, a pedestal temperature of about 40 degrees Celsius, a DC power of about 10 to about 20 KW, and an RF bias of about 2 KW to about 3 KW.

In an embodiment, a portion of the material 210 may be re-deposited from the line of sight region 205 of the undercut region to the anchor region 207 by utilizing the RF bias. In an embodiment, a process time may comprise about 30 to about 60 seconds and may form about 20 nm of the first layer of material 210 in the anchor region 207. In an embodiment, the pedestal/chuck 104 within the deposition chamber is RF biased (referring back to FIG. 1), which directs a large argon ion flux to the bottom of the microvia 204, such that a portion of first conductive layer 210 is selectively removed from the microvia 204 bottom/line of sight region 205, and is re-deposited within the anchor region 207.

For example, once a desired thickness of the first conductive layer 210 is achieved for the particular application, the DC power may be reduced in the chamber to maintain a low level of deposition rate, wherein line of sight areas 205 of the substrate 106 acquire deposition, while sidewalls receive little to no deposition of the first conductive layer 210. Simultaneously, an RF bias may be applied independently from an independent power source that directs a larger argon ion flux to the microvia 204 bottom, and causes a re-sputter effect. Since the DC deposition/formation rate is lower at the bottom during the RF bias step, the first conductive layer is selectively removed from the microvia 204 bottom, and is then re-deposited within the anchor regions 207 of the undercut region 208.

Since the top and open field areas of the microvia are still receiving a low DC deposition rate, there is no significant loss of the first conductive layer 210 in these areas. DC, RF and chamber pressure can be optimized to achieve neutral etch-deposition ratios in the non-anchor/field regions, while achieving re-sputtering at the bottom of the microvia 204. A portion of a re-sputtered first conductive layer 210' may now be located in the anchor region 207, since a portion of the first conductive layer of material 210 has been re-sputtered from the line of sight region 205 into the anchor region 207.

Figure 2E:
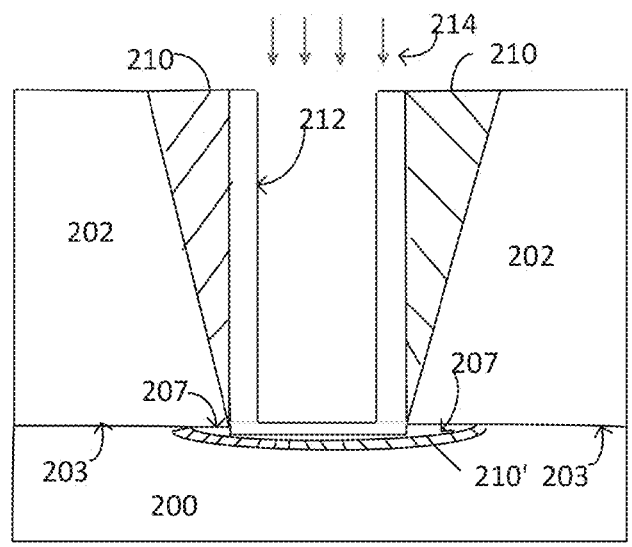

In an embodiment, a second conductive layer 212 may be formed in the microvia 204 by utilizing a second deposition process 214 (FIG. 2e). The second conductive layer 212 may comprise a layer of copper material 212 in an embodiment. The second conductive layer 212 may be substantially formed on the first layer of material 210 and in the line of sight region 205 of the first layer of titanium material 210. In an embodiment, the second layer of copper material 212 is formed utilizing a DC PVD process and does not employ an RF bias, wherein the copper material 212 is formed in a line of sight manner, such that it is substantially formed within the microvia opening 204 and not within the anchor region 207 of the undercut region 208. The anchor region 207 is located adjacent the line of sight region 205 and underneath the sidewalls of the dielectric material 202, and above the first conductive layer 210' that has been re-sputtered from the first deposition process 209. Thus, the anchor region 207 comprises little to no second conductive layer 212 subsequent the second deposition process 211.

In an embodiment, the second deposition process 214 may comprise a system base pressure of about $10^{-8}$ Torr, a process pressure of about 1 to about 25 mTorr, an argon flow rate of about 10 to about 100 standard cubic centimeters per minute (sccm), a pedestal temperature of about 40 degrees Celsius a DC power of between about 100 KW to about 150 KW, and an RF bias of zero. The process time may vary depending upon the application, but in one embodiment may comprise about 180 to about 300 seconds and the second conductive layer 212 may comprise a thickness of about 500 nm of the first conductive layer.

Figure 2F:
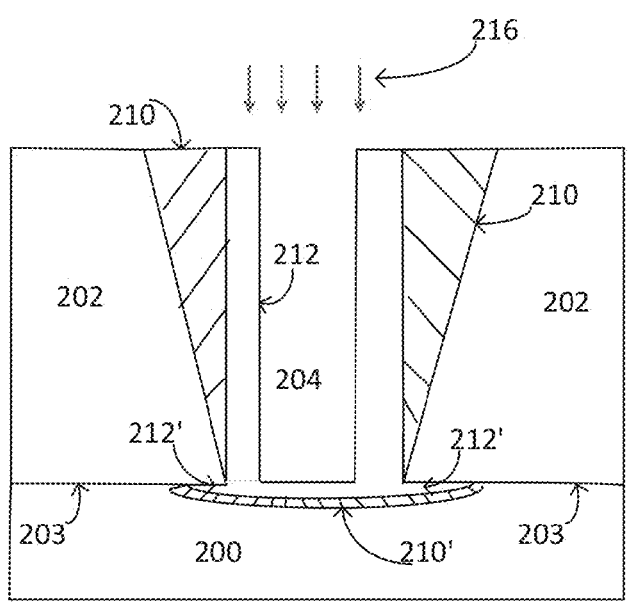

In an embodiment, a second conductive layer re-sputter deposition process 216 may be employed (FIG. 2f). The second conductive layer re-sputter process 216 may comprise both a DC power and an RF power component. In an embodiment, the second conductive layer re-sputter deposition process 216 may comprise a process pressure of about 1 to about 25 mTorr, an argon flow rate of about 5 to about 25 sccm, a pedestal temperature of about 40 degrees Celsius, a DC power of about 10 to about 20 KW, and an RF bias of about 2 KW to about 3 KW. In an embodiment, a process time may comprise about 180 to about 240 seconds and may form/re-sputter about 100 nm of the second conductive layer 212.

In an embodiment, a portion of the material 212 may be re-deposited/re-sputtered from the line of sight region 205 of the undercut region to the anchor region 207 by utilizing the RF bias. Thus, a portion of the re-sputtered second conductive layer 212' may now be located in the anchor region 207, wherein a portion of the second layer of material 212 may be re-sputtered from the line of sight region 205 into the anchor region 207, and may be formed on the first conductive layer 210' within the anchor region 207. In an embodiment, the anchor structure 207 may be substantially filled with the first conductive layer 210 disposed on the second conductive layer 212.

Figure 2G:
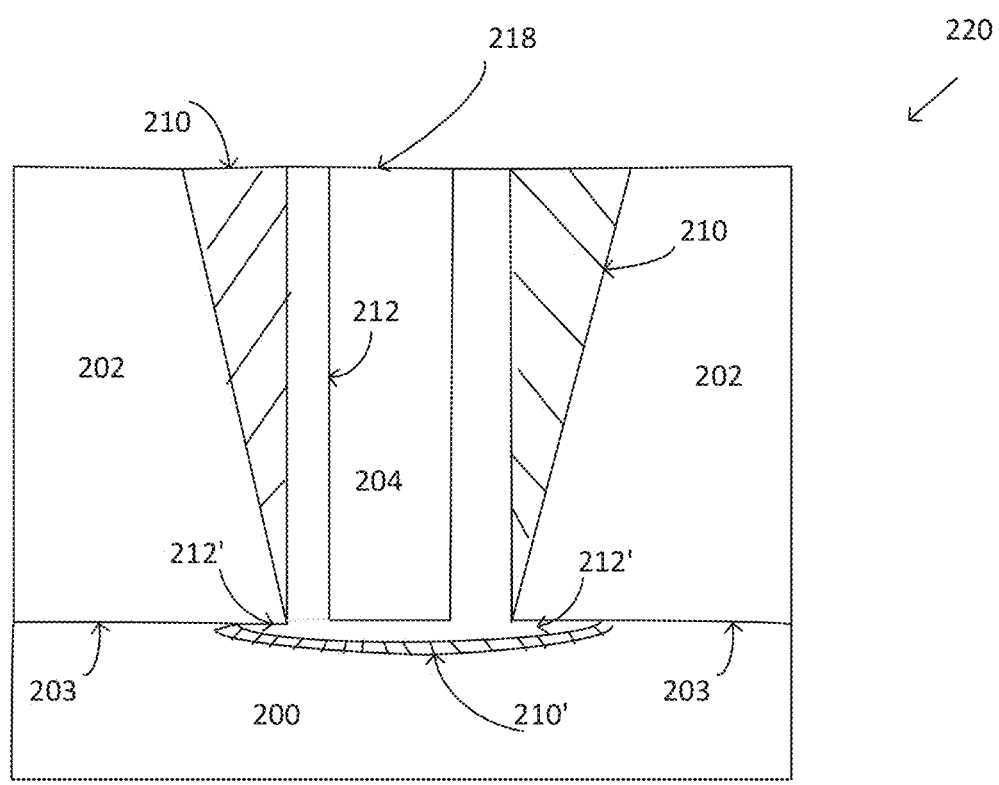

In an embodiment, a conductive fill material 218 may be formed within the microvia opening 204, to fill the microvia 204 and form a microvia with an anchor structure 220 (FIG. 2g). In an embodiment, the conductive fill material 218 may comprise a copper material, such as an electrolytic copper fill material 218 for example. In an embodiment, an electrolytic process may be utilized to form the conductive fill material 218.

Figure 2H:
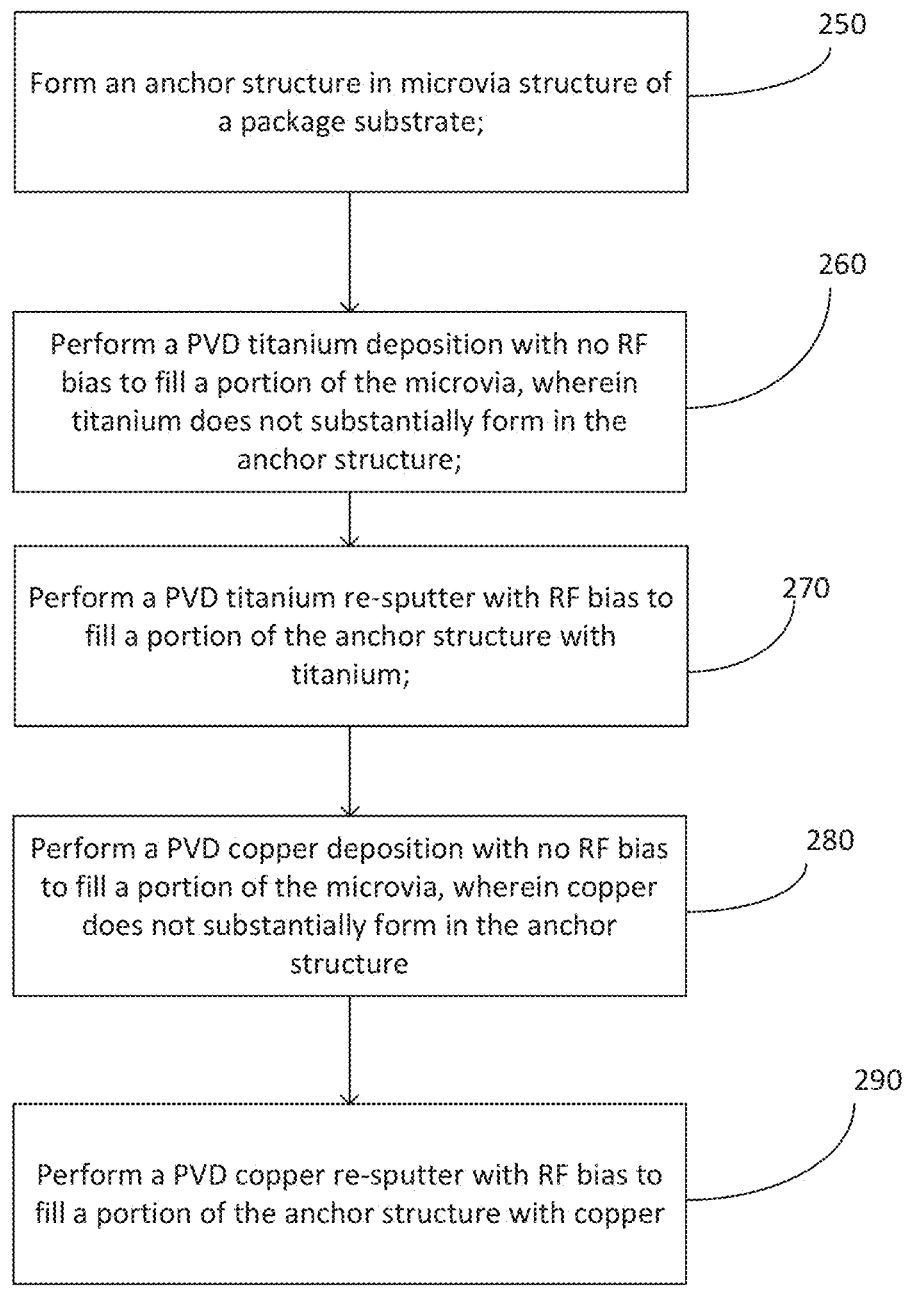
FIG. 2h represents a flow chart of a method according to embodiments.

FIG. 2h depicts a flow chart of a method of forming a substrate microvia comprising an anchor structure. At step 250, a packaging substrate comprising a microvia may undergo a soft etch process, wherein an undercut region comprising an anchor structure may be formed. In an embodiment, the soft etch process may comprise sodium persulfate (150+/−15 g/l) in 50% H2SO4 (by volume). In an embodiment, a process time may comprise between about 30 to about 120 seconds at a temperature of between about 30 to about 40 degrees Celsius.

At step 260, a PVD titanium deposition may be performed in the microvia with no RF bias to fill a portion of the microvia. The titanium does not substantially form in the anchor structure. At step 270, a PVD titanium re-sputter may be performed in the microvia with RF bias, to fill a portion of the anchor structure. At step 280, a PVD copper deposition may be performed in the microvia with no RF bias, wherein a portion of the microvia is filled, and wherein there is no substantial copper deposition in the anchor structure. At step 290, a PVD copper re-sputter may be performed in the microvia with RF bias, wherein at least a portion of the anchor structure is filled with copper. In an embodiment, the anchor structure is substantially filled with copper disposed on titanium.

Figure 5A:
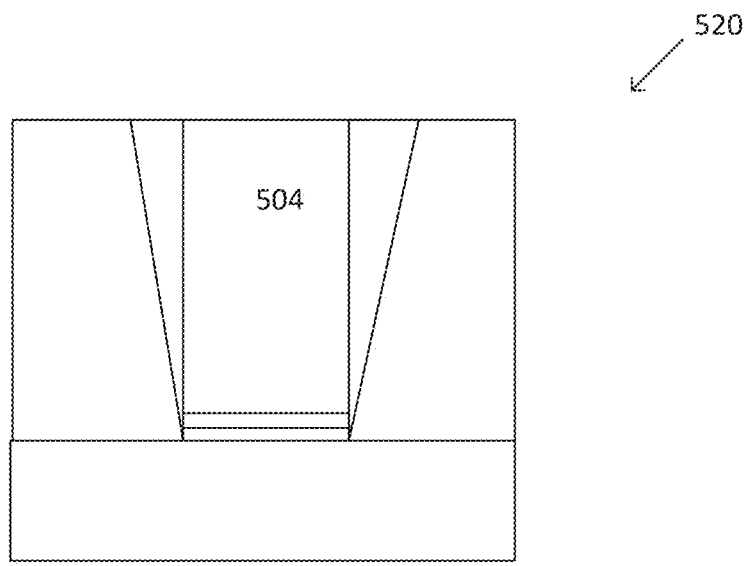
FIGS. 5a-5b represents structures according to the prior art.
Figure 5B:
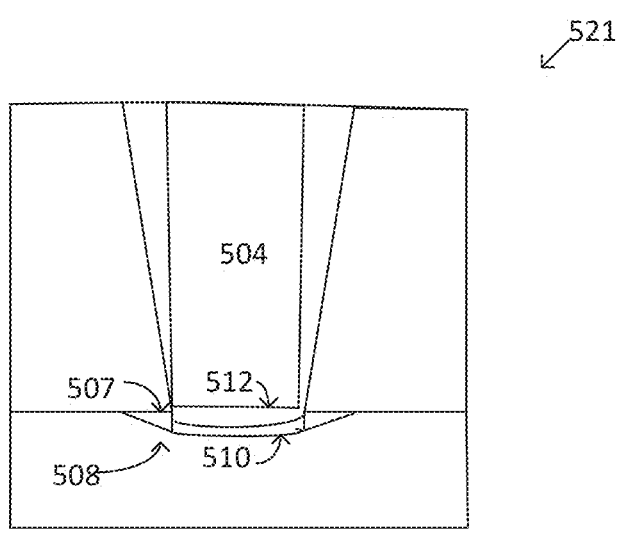

The various embodiments of the microvia structure comprising an anchor structure included herein enable the use of sputter seed deposition processing for substrate microvias with anchors in undercut regions. The embodiments herein, which utilize PVD copper seed, enable the use of low loss dielectric materials. In some Prior art PVD copper seed microvia structures 520, 521 (such as those depicted in FIGS. 5a-5b, Prior Art, respectively), the microvia 504 may comprise no undercut, due to PVD line of sight properties (FIG. 5a, Prior Art). The lack of undercut use results in lower microvia pull strength due to lack of anchoring/adhesion by the anchoring structure, such as those included in the embodiments herein.

In another Prior art microvia structure 521 (FIG. 5b, Prior Art) the use of an undercut 508 comprising an anchor structure 507 may contain voids in the anchor structure 207 due to seed/conductive film discontinuity in the anchor structure 207 of undercut region 508. These voids occur largely due to the lack of re-sputter processing to fill the voids and avoid only line of sight deposition. The adhesion film (such as titanium) at the bottom of the via may also comprise a high resistance. In contrast, the anchor structures of the embodiments herein comprise no plating voids, and provide excellent anchor strength. The embodiments herein improve adhesion of copper/conductive materials to the dielectric materials, thus promoting microvia reliability in package substrates by selectively re-depositing conductive layers from line of sight areas in the microvia bottom to anchor structures of the undercut region.

In an embodiment, the package substrates of the embodiments herein (such as the package substrate depicted in FIG. 2g, for example), which may comprise conductive layers that may be built up and separated by insulating materials, may be coupled with various microelectronic devices. The devices comprise such devices as a microelectronic memory die and a central processing unit (CPU) die in some cases, but may comprise any type of suitable device according to the particular application. In an embodiment, the package substrate may comprise a portion of an organic core package, and a coreless, bumpless build up layer (BBUL) package structure.

In an embodiment, the package structures of the embodiments herein may comprise any type of package substrate capable of providing electrical communications between a microelectronic device, such as a die and a next-level component to which the package structures may be coupled (e.g., a circuit board). In another embodiment, the package substrate that may comprise any suitable type of package structures capable of providing electrical communication between a die and an upper integrated circuit (IC) package coupled with the device layer.

In some embodiments the package substrate/structure may further comprise a plurality of dies, which may be stacked upon one another, depending upon the particular embodiment. In some cases the die(s) may be located/attached/embedded on either the front side, back side or on/in some combination of the front and back sides of a package structure. In an embodiment, the die(s) may be partially or fully embedded in a package structure of the embodiments. The package structure may comprise a multi-chip 3D package structure that may include a central processing unit (CPU) in combination with other devices, in an embodiment.

Figure 3:
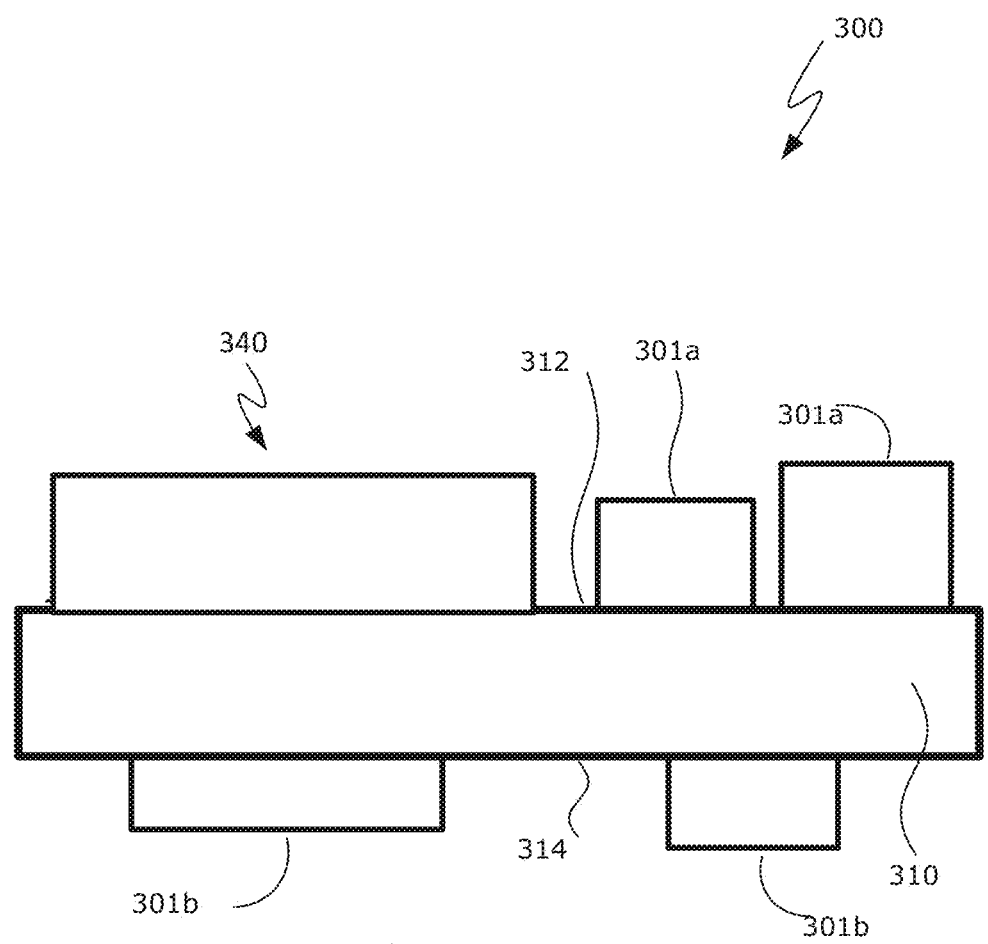
FIG. 3 represents a cross-sectional view of a structure according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 disposed on the mainboard's first side 312, wherein the package structure 340 may comprise any of the package substrates with microvia comprising anchor structure embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301a may be disposed on the first side 312 of the mainboard 310, and components 301b may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
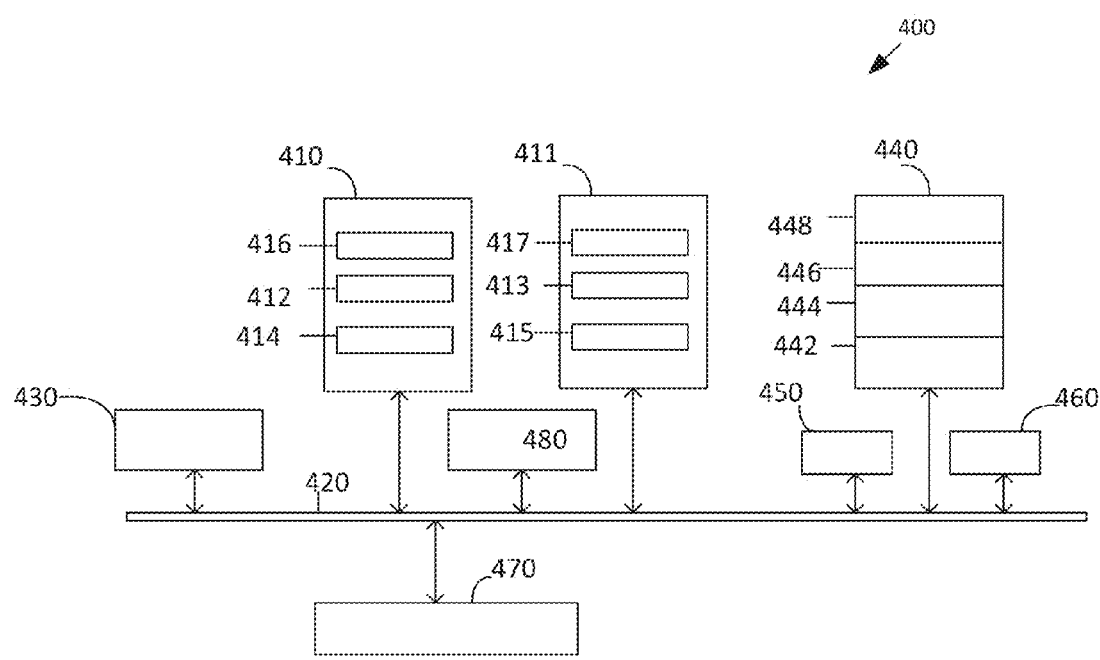
FIG. 4 represents a schematic of a system according to embodiments.

FIG. 4 is a schematic of a computer system 400 according to an embodiment. The computer system 400 (also referred to as the electronic system 400) as depicted can include a package structure/substrate that includes any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device of the various embodiments included herein. In an embodiment, the integrated circuit 410 includes a processor 412 that can include any type of packaging structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:
1. A structure comprising:
 a first conductive layer disposed in an opening of a package substrate, wherein a portion of the first conductive layer is disposed in and entirely covering a bottom of an anchor region, wherein the anchor region is disposed underneath a bottom portion of a dielectric layer, wherein the dielectric layer is adjacent the opening;

another portion of the first conductive layer disposed in the opening abutting the dielectric layer, wherein the portion of the first conductive layer disposed in the anchor region does not contact the another portion of the first conductive layer disposed in the opening; and a second conductive layer disposed on the first conductive layer.

2. The structure of claim 1 wherein the first conductive layer comprises titanium and the second conductive layer comprises copper.

3. The structure of claim 1 further comprising wherein the first conductive layer comprises a PVD titanium material, and wherein the second conductive layer comprises a PVD copper seed material.

4. The structure of claim 1 further comprising wherein the opening comprises a microvia opening, wherein the microvia opening comprises an undercut region, and wherein the undercut region comprises a bottom region and an adjacent anchor region.

5. The structure of claim 1 wherein the package substrate comprises a portion of a 3d multi-chip package substrate.

6. The structure of claim 1 wherein an electrolytic copper material is disposed on the second conductive layer.

7. The structure of claim 1 further comprising wherein a first portion of the second conductive layer is disposed in the anchor region, and wherein a second portion of the second conductive layer is disposed in a bottom portion of the opening.

8. The structure of claim 1 wherein the package substrate is coupled with a CPU.

9. The structure of claim 1 wherein the package substrate comprises a portion of a system on a chip.

10. The structure of claim 1 further comprising a system comprising:

a bus communicatively coupled to the structure; and an eDRAM communicatively coupled to the bus.

11. The structure of claim 1 wherein the second conductive layer is disposed on the first conductive layer in the anchor region, and wherein the second conductive layer is substantially continuous between the bottom portion of the opening and the anchor region.

* * * * *